US007291438B2

(12) United States Patent
Sakurai et al.

(10) Patent No.: US 7,291,438 B2
(45) Date of Patent: Nov. 6, 2007

(54) NEGATIVE PHOTOSENSITIVE COMPOSITION AND NEGATIVE PHOTOSENSITIVE LITHOGRAPHIC PRINTING PLATE

(75) Inventors: Hideo Sakurai, Ageo (JP); Eiji Hayakawa, Utsunomiya (JP)

(73) Assignee: Eastman Kodak Company, Rochester, NY (US)

( * ) Notice: Subject to any disclaimer, the term of this patent is extended or adjusted under 35 U.S.C. 154(b) by 153 days.

(21) Appl. No.: 10/558,956

(22) PCT Filed: Jun. 17, 2004

(86) PCT No.: PCT/JP2004/008826

§ 371 (c)(1), (2), (4) Date: Nov. 30, 2005

(87) PCT Pub. No.: WO2004/114019

PCT Pub. Date: Dec. 29, 2004

(65) Prior Publication Data

US 2006/0251987 A1 Nov. 9, 2006

(30) Foreign Application Priority Data

Jun. 18, 2003 (JP) ............................. 2003-173573

(51) Int. Cl.
*G03F 7/021* (2006.01)
*G03F 7/031* (2006.01)

(52) U.S. Cl. ................ 430/175; 430/278.1; 430/281.1; 430/288.1; 430/302

(58) Field of Classification Search ................ 430/175, 430/278.1, 281.1, 288.1, 302
See application file for complete search history.

(56) References Cited

U.S. PATENT DOCUMENTS 5,385,807 A 1/1995 Okamoto et al.
7,029,820 B2 * 4/2006 Hotta et al. ................ 430/165
2001/0018164 A1 8/2001 Furukawa
2002/0177074 A1 11/2002 Hoshi et al.

FOREIGN PATENT DOCUMENTS

DE 101 03 964 1/2001
EP 0 438 123 7/1991

OTHER PUBLICATIONS

JP Abstract 2003-107685 (Apr. 9, 2003).
JP Abstract 2002-287334 (Oct. 3, 2002).
JP Abstract 2001-290271 (Oct. 19, 2001).
JP Abstract 2001-228611 (Aug. 24, 2001).
JP Abstract 2001-226605 (Aug. 21, 2001).
JP Abstract 2000-098603 (Apr. 7, 2000).
JP Abstract 05-194619 (Aug. 3, 1993).
JP Abstract 05-005988 (Jan. 14, 2003).

* cited by examiner

*Primary Examiner*—John S. Chu
(74) *Attorney, Agent, or Firm*—J. Lanny Tucker

(57) ABSTRACT

There are provided a negative-working photosensitive composition which can be cured by infrared rays and is less likely to suffer polymerization inhibition by oxygen during radical polymerization, and also exhibits high adhesion with a metal, and a negative-working photosensitive lithographic printing plate which is capable of directly forming images by irradiation with infrared rays from a solid or semiconductor laser based on digital signals, and also has high sensitivity and excellent printing durability. The negative-working photosensitive composition contains an infrared absorber (A), an organoboron compound (B) which functions as a polymerization initiator by using in combination with the infrared absorber (A), a compound having a polymerizable unsaturated group (C) and a diazo resin (D), and the negative-working photosensitive lithographic printing plate comprises a support, and a photosensitive layer containing the negative-working photosensitive composition formed on the support.

10 Claims, No Drawings

NEGATIVE PHOTOSENSITIVE COMPOSITION AND NEGATIVE PHOTOSENSITIVE LITHOGRAPHIC PRINTING PLATE

TECHNICAL FIELD

The present invention relates to a negative-working photosensitive composition and a negative-working photosensitive lithographic printing plate used in the offset printing field and, more particularly, to a negative-working photosensitive lithographic printing plate used as a so-called computer-to-plate (CTP) plate capable of directly forming images, by irradiation with infrared rays from a solid or semiconductor laser based on digital signals, and a negative-working photosensitive composition suitable for use in a photosensitive layer of such a lithographic printing plate.

PRIOR ART

With the progress of computer image processing techniques, a method of directly writing images by light irradiation corresponding to digital signals has recently been developed. An intense interest has been shown towards a computer-to-plate (CTP) system of directly forming images on a photosensitive lithographic printing plate, without outputting the images to silver salt mask films by utilizing this method in lithographic printing plates. A CTP system using a high-output laser, having a maximum intensity within a near infrared or infrared range as a source of light, has advantages such that high-resolution images can be obtained by exposure in a short time and a photosensitive lithographic printing plate used in the system can be handled in daylight. Particularly, high-output and small-sized lasers are easily available as solid and semiconductor lasers, which emit infrared rays having a wavelength within a range from 760 to 1200 nm.

As the negative-working photosensitive lithographic printing plate which can form images using the solid or semiconductor laser, a negative-working photosensitive lithographic printing plate comprising a photosensitive layer comprising of a negative-working photosensitive composition containing an alkali-soluble resin (novolak resin, etc.), a compound capable of being crosslinked by an acid (acid crosslinking agent such as a resol resin), a compound capable of generating an acid by heat (acid generator), and a photothermal converting agent (infrared absorber such as a dye or pigment) has been proposed in Japanese Unexamined Patent Publication (Kokai) No. 7-20629 (Patent Document 1).

In this negative-working photosensitive lithographic printing plate, it is found that negative images are formed in the following manner. First, when the photosensitive layer is irradiated with infrared rays from the solid or semiconductor laser, infrared rays are converted into heat by the photothermal converting agent in the photosensitive layer. An acid is generated, from the acid generator, by the heat. When pre-heated prior to development, a catalytic action of the acid causes the crosslinking reaction between the acid crosslinking agent and the alkali-soluble resin or the crosslinking reaction between the acid crosslinking agents, and thus the photosensitive layer exposed to infrared rays is made insoluble in an alkali developing solution. Consequently, an image area is formed.

However, this negative-working photosensitive lithographic printing plate must be pre-heated prior to development and, therefore, a negative-working photosensitive lithographic printing plate, which does not require pre-heating, has been desired.

As the negative-working photosensitive lithographic printing plate which can form images using the solid or semiconductor laser and does not require pre-heating, a negative-working photosensitive lithographic printing plate having a photosensitive layer comprising of a negative-working photosensitive composition containing an infrared absorber, an onium salt, a radical polymerizable compound and a binder is proposed in Japanese Unexamined Patent Publication (Kokai) No. 2001-125260 (Patent Document 2).

In this negative-working photosensitive lithographic printing plate, the onium salt functions as an initiator of radical polymerization. Therefore, when irradiated with infrared rays, radical polymerization of the radical polymerizable compound proceeds and the photosensitive later is cured and, thus, the photosensitive layer exposed to infrared rays is made insoluble in a developing solution. Consequently, an image area is formed.

However, this negative-working photosensitive lithographic printing plate had a problem in that it has low sensitivity because the polymerization is inhibited by oxygen in an air during the radical polymerization, and is also inferior in printing durability because the image area thus formed has insufficient strength. In the negative-working photosensitive lithographic printing plate, deterioration of printing durability was caused by poor adhesion with metal as a support of the photosensitive layer.

(Patent Document 1)

Japanese Unexamined Patent Publication (Kokai) No. 7-20629

(Patent Document 2)

Japanese Unexamined Patent Publication (Kokai) No. 2001-125260

DISCLOSURE OF THE INVENTION

Thus, an object of the present invention is to provide a negative-working photosensitive composition which can be cured by infrared rays and is less likely to suffer polymerization inhibition, by oxygen, during radical polymerization, and also exhibits high adhesion with metal, and a negative-working photosensitive lithographic printing plate which is capable of directly forming images by irradiating with infrared rays from a solid or semiconductor laser based on digital signals, and also has high sensitivity and excellent printing durability.

That is, a negative-working photosensitive composition comprising:

(A) an infrared absorber, (B) an organoboron compound which functions as a polymerization initiator by using in combination with the infrared absorber (A), (C) a compound having a polymerizable unsaturated group, and (D) a diazo resin.

The infrared absorber (A) is preferably a near infrared absorbable cationic dye represented by the following formula (1):

$$D^+A^- \qquad (1)$$

wherein $D^+$ represents a cationic dye having an absorption within a near infrared range, and $A^-$ represents an anion.

The organoboron compound (B) is preferably an ammonium salt of a quaternary boron anion represented by the following formula (2):

(2)

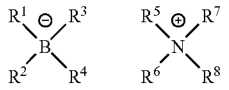

wherein $R^1$, $R^2$, $R^3$ and $R^4$ each independently represents an alkyl group, an aryl group, an alkaryl group, an allyl group, an aralkyl group, an alkenyl group, an alkynyl group, an alicyclic group, or a saturated or unsaturated heterocyclic group, and at least one of $R^1$, $R^2$, $R^3$ and $R^4$ is an alkyl group having 1 to 8 carbon atoms, and $R^5$, $R^6$, $R^7$ and $R^8$ each independently represents a hydrogen atom, an alkyl group, an aryl group, an allyl group, an alkaryl group, an aralkyl group, an alkenyl group, an alkynyl group, an alicyclic group, or a saturated or unsaturated heterocyclic group.

The negative-working photosensitive composition of the present invention further comprises a binder resin (E), preferably.

The binder resin (E) is preferably an alkali-soluble resin.

The negative-working photosensitive lithographic printing plate of the present invention comprises a support, and a photosensitive layer containing the negative-working photosensitive composition of the present invention formed on the support.

BEST MODE FOR CARRYING OUT THE INVENTION

The present invention will now be described in detail.

<(A) Infrared Absorber>

The infrared absorber (A) in the present invention is a substance wherein a maximum absorption wavelength is within a near infrared or infrared range and, for example, is a substance wherein a maximum absorption wavelength is within a range from 760 nm to 1200 nm. Examples of the substance include various pigments or dyes.

The pigments used in the present invention are commercially available pigments, and are described, for example, in Color Index, "Latest Pigment Handbook", (edited by the Japan Association of Pigment Technology, 1977 edition), "Latest Pigment Application Technologies" (CMC, 1986), and "Printing Ink Technologies" (CMC, 1984). Examples of the pigments include black pigments, yellow pigments, orange pigments, brown pigments, red pigments, purple pigments, blue pigments, green pigments, fluorescent pigments, and polymers containing chemically combined dyes. Specific examples of the pigments are insoluble azo pigments, azo lake pigments, condensed azo pigments, chelated azo pigments, phthalocyanine-based pigments, anthraquinone-based pigments, perylene- and perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, and carbon black.

Among these pigments, carbon black is preferably used as a substance which efficiently absorbs light within a near infrared or infrared range and is economically excellent. As these carbon blacks, grafted carbon blacks, which have various functional groups and are excellent in dispersibility, are commercially available and are described on page 167 of "Carbon Black Handbook, Third Edition" (edited by the Association of Carbon Black, 1995) and page 111 of "Characteristics and Optimum Formulation of Carbon Black and Application Technique" (edited by the Association of Technical Information, 1997), and any of these carbon blacks can be preferably used in the present invention.

These pigments may be used without being surface-treated or may be used after being subjected to surface treatments known in the art. The known surface treatments include a treatment wherein a resin or a wax is coated on the surface of the pigments, a treatment wherein a surface active agent is adhered to the surface of the pigments, and a treatment wherein a reactive substance such as a silane coupling agent, an epoxy compound or a polyisocyanate is bonded to the surface of the pigments. These surface-treating methods are described in "Properties and Applications of Metal Soaps" (Saiwai Shobo K. K.), "Latest Pigment Application Technologies" (CMC, published 1986), and "Printing Ink Technologies" (CMC, published 1984).

The particle diameter of the pigments used in the present invention is preferably within a range from 0.01 to 15 μm, and more preferably from 0.01 to 5 μm.

The dyes used in the present invention are commercially available dyes and dyes known in the art and described, for example, in "Dye Handbook" (edited by the Association of Organic Synthesis Chemistry, published 1970), "Handbook of Color Material Engineering" (edited by the Japan Society of Color Material, Asakura Shoten K. K., published 1989), "Technologies and Markets of Industrial Pigments" (CMC, published 1983), and "Chemical Handbook, Applied Chemistry Edition" (edited by The Chemical Society of Japan, Maruzen Shoten K. K., published 1986). Specific examples of the dyes include azo dyes, azo dyes in the form of metal complex salts, pyrazolone azo dyes, anthraquinone dyes, phthalocyanine dyes, carbonium dyes, quinonimine dyes, methine dyes, cyanine dyes, indigo dyes, quinoline dyes, nitro-based dyes, xanthene dyes, thiazine-based dyes, azine dyes, and oxazine dyes.

The dyes which absorb light within a near infrared or infrared range are, for example, cyanine dyes, methine dyes, naphthoquinone dyes, squalirium dyes, arylbenzo(thio)pyridinium salts, trimethinethiapyrylium salts, pyrylium compounds, pentamethinethiapyrylium salts, and infrared absorbing dyes.

Among these dyes, the infrared absorber (A) is preferably a near infrared absorbable cationic dye represented by the following formula (1):

$$D^+A^- \quad (1)$$

wherein $D^+$ represents a cationic dye having an absorption within a near infrared range, and $A^-$ represents an anion, because it efficiently enables an organoboron compound (B) described hereinafter to exert a polymerization function.

Examples of the cationic dye having an absorption within a near infrared range include cyanine-based dyes, triarylmethane-based dyes, aminium-based dyes, and diimmonium-based dyes, which have an absorption within a near infrared range. Specific examples of the cationic dye having an absorption within a near infrared range include the following.

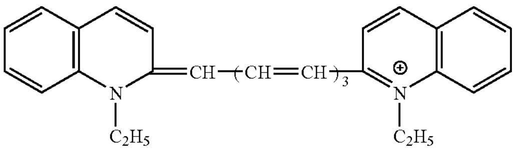
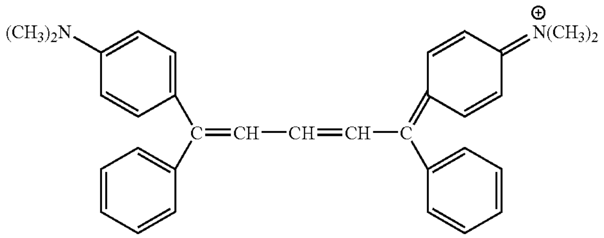
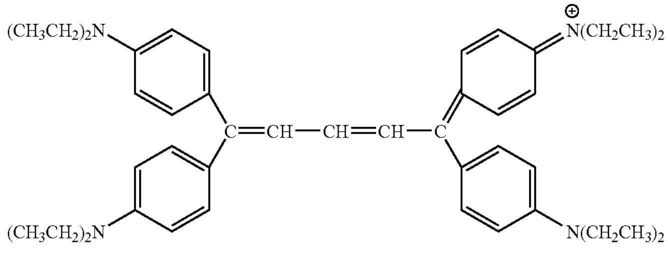
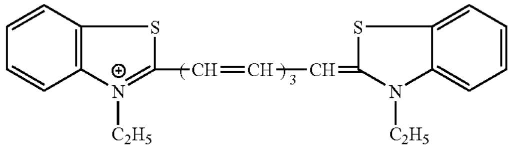
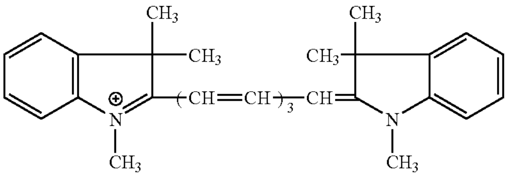
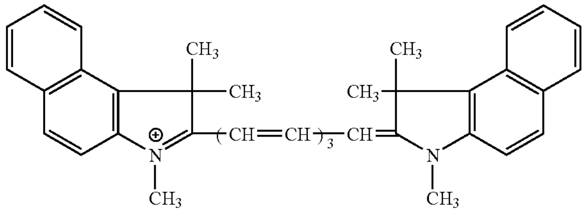
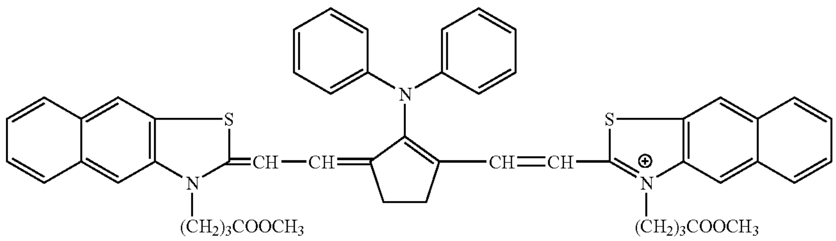
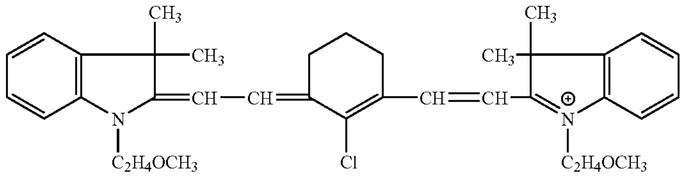
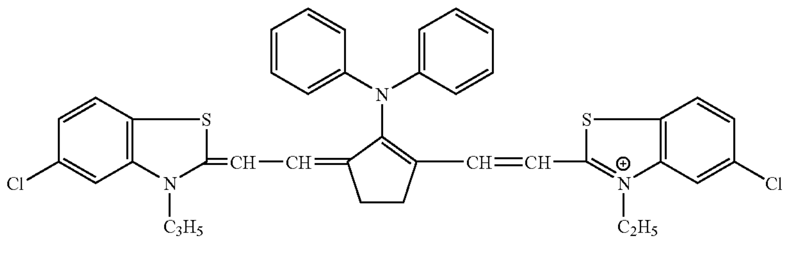

-continued

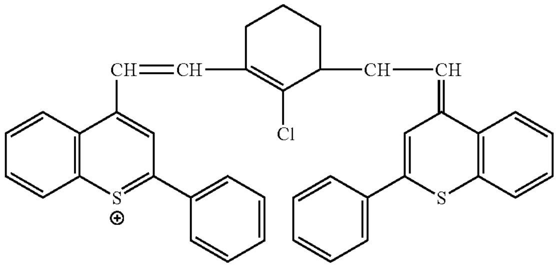

Examples of the anion include the halogen anions $ClO_4^-$, $PF_6^-$, $BF_4^-$, $SbF_6^-$, $CH_3SO_3^-$, $CF_3SO_3^-$, $C_6H_5SO_3^-$, $CH_3C_6H_4SO_3^-$, $HOC_6H_4SO_3^-$, $ClC_6H_4SO_3^-$, and a boron anion represented by the following formula (3). The boron anion is preferably a triphenyl n-butylboron anion or a trinaphthyl n-butylboron anion.

(3)

wherein $R^1$, $R^2$, $R^3$ and $R^4$ each independently represents an alkyl group, an aryl group, an alkaryl group, an allyl group, an aralkyl group, an alkenyl group, an alkynyl group, an alicyclic group, or a saturated or unsaturated heterocyclic group, and at least one of $R^1$, $R^2$, $R^3$ and $R^4$ is an alkyl group having 1 to 8 carbon atoms.

As the cationic dye having an absorption within a near infrared range, those represented by the following formula (4) are preferable. As these dyes have a maximum absorption wavelength within a range from 817 to 822 nm, the resulting photosensitive lithographic printing plate is suitable for an exposing machine equipped with an existing near infrared semiconductor laser. As a molar extinction coefficient is $1\times10^5$ or more, the resulting photosensitive lithographic printing plate is excellent in sensitivity.

(4)

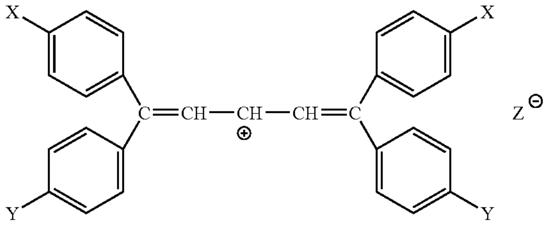

wherein X represents $N(C_2H_5)_2$ or $N(CH_3)_2$, Y represents $N(C_2H_5)_2$, H or $OCH_3$, and $Z^-$ represents any of anions represented by the following formulas.

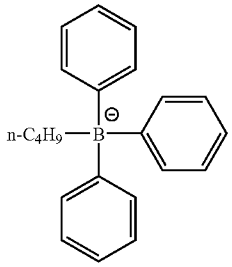

,

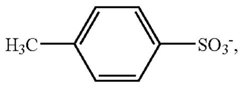

, $CF_3SO_3^-$

The infrared absorber (A) is used by adding it to a negative-working photosensitive composition after selecting at least one suitable pigment or dye capable of absorbing a specific wavelength of a light source described hereinafter from among the pigments or dyes described above.

When the pigment is used as the infrared absorber (A), the content of the pigment is preferably within a range from 0.5 to 15% by weight, and particularly preferably from 1 to 10% by weight, based on the total solid content of the negative-working photosensitive composition. When the content of the pigment is less than 0.5% by weight, infrared rays are not sufficiently absorbed. On the other hand, when the content of the pigment is more than 15% by weight, an excess amount of heat tends to be generated. Therefore, it is not preferred.

When the dye is used as the infrared absorber (A), the content of the dye is preferably from 0.5 to 15% by weight, and particularly preferably from 1 to 10% by weight, based on the total solid content of the negative-working photosensitive composition. When the content of the pigment is less than 0.5% by weight, infrared rays are not sufficiently absorbed. On the other hand, when the content of the dye is more than 15% by weight, absorption of infrared rays is substantially saturated and thus the addition effect may not be enhanced. Therefore, it is not preferred.

<(B) Organoboron Compound>

The organoboron compound (B) used in the present invention functions as a polymerization initiator by using in combination of the infrared absorber (A) described above. The organoboron compound (B) is preferably an ammonium salt of a quaternary boron anion represented by the following formula (2):

(2)

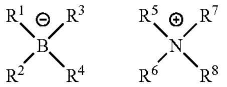

wherein $R^1$, $R^2$, $R^3$ and $R^4$ each independently represents an alkyl group, an aryl group, an alkaryl group, an allyl group, an aralkyl group, an alkenyl group, an alkynyl group, an alicyclic group, or a saturated or unsaturated heterocyclic group, and at least one of $R^1$, $R^2$, $R^3$ and $R^4$ is an alkyl group having 1 to 8 carbon atoms, and $R^5$, $R^6$, $R^7$ and $R^8$ each independently represents a hydrogen atom, an alkyl group, an aryl group, an allyl group, an alkaryl group, an aralkyl group, an alkenyl group, an alkynyl group, an alicyclic group, or a saturated or unsaturated heterocyclic group.

Among these organoboron compounds, there can be preferably used tetra n-butylammonium triphenylboron, tetra n-butylammonium trinaphthylboron, tetra n-butylammonium tri(p-t-butylphenyl)boron, tetramethylammonium n-butyltriphenylboron, tetramethylammonium n-butyltrinaphthylboron, tetramethylammonium n-octyltriphenylboron, tetramethylammonium n-octyltrinaphthylboron, tetraethylammonium n-butyltriphenylboron, tetraethylammonium n-butyltrinaphthylboron, trimethylhydrogenammonium n-butyltriphenylboron, triethylhydrogenammonium n-butyltriphenylboron, tetrahydrogenammonium n-butyltriphenylboron, tetramethylammonium tetra n-butylboron, and tetraethylammonium tetra n-butylboron.

The organoboron compound (B) in the present invention can function as a polymerization initiator by irradiation with infrared rays to generate a radical (R.), as shown in the following scheme (5):

(5)

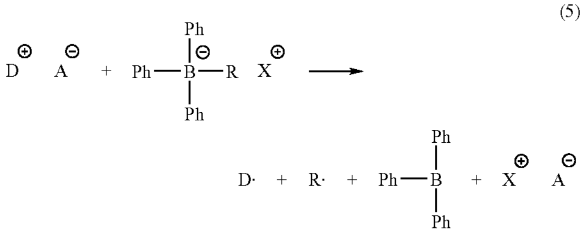

wherein Ph represents a phenyl group, R represents an alkyl group having 1 to 8 carbon atoms, and $X^+$ represents an ammonium ion, when using in combination with the infrared absorber (A) (for example, $D^+A^-$).

The content of the organoboron compound (B) is preferably within a range from 1 to 15% by weight, and particularly from 3 to 10% by weight, based on the solid content of the negative-working photosensitive composition. When the content of the organoboron compound (B) is less than 1% by weight, insufficient polymerization reaction causes insufficient curing, resulting in weak image area of the photosensitive lithographic printing plate. On the other hand, when the content of the organoboron compound (B) is more than 15% by weight, the polymerization reaction does not proceed efficiently. If necessary, two or more organoboron compounds (B) may be used. Also the organoboron compound (B) may be used in combination with known polymerization initiators used in the radical polymerization, such as triazines.

<(C) Compound Having a Polymerizable Unsaturated Group>

The compound having a polymerizable unsaturated group (C) in the present invention is a monomer or oligomer having one, and preferably two or more, addition-polymerizable ethylenically unsaturated groups, and the boiling point at normal pressure is preferably 100° C. or higher.

Examples of the monomer or oligomer include monofunctional (meth)acrylates such as polyethylene glycol mono(meth)acrylate [hereinafter, methacrylate and acrylate are referred generically as (meth)acrylate], polypropylene glycol mono(meth)acrylate, and phenoxyethyl (meth)acrylate; polyfunctional (meth)acrylates such as polyethylene glycol di(meth)acrylate, polypropylene glycol di(meth)acrylate, trimethylolpropane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol di(meth)acrylate, tri(acryloyloxyethyl) isocyanurate, (meth)acrylate of polyhydric alcohol-alxylene oxide adduct, (meth)acrylate of polyhydric phenol alkylene oxide adduct, urethane acrylates, polyester acrylates, epoxy acrylates obtained by adding epoxy resin and (meth)acrylic acid; and polyfunctional allyl compounds such as allyl isocyanurate and allyl cyanurate.

The content of the compound having a polymerizable unsaturated group (C) is preferably within a range from 5 to 60% by weight based on the solid content of the negative-working photosensitive composition. When the content of the compound having a polymerizable unsaturated group (C) is less than 5% by weight, sufficient curing is not attained. On the other hand, when the content of the compound having a polymerizable unsaturated group (C) is more than 60% by weight, the resulting photosensitive lithographic printing plate has a sticky photosensitive layer. If necessary, two or more compounds having a polymerizable unsaturated group (C) may be used in combination.

<(D) Diazo Resin>

Examples of the diazo resin (D) include diazo resins typified by a salt of a condensate of diazodiarylamine and an active carbonyl compound.

Examples of particularly preferable diazo resin include organic or inorganic acid salts of condensates of 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxydiphenylamine, and 4-diazo-3-methoxydiphenylamine with formaldehyde, paraformaldehyde, acetaldehyde, benzaldehyde, and 4,4'-bis-methoxymethyl diphenyl ether.

Examples of the organic acid of the diazo resin include methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, and 2-hydroxy-4-methoxybenzophenone-5-sulfonic acid. Examples of the inorganic acid include hexafluorophosphoric acid, tetrafluoroboric acid and thiocyanic acid.

There can also be used a diazo resin wherein a main chain is a polyester group; a diazo resin obtained by reacting a polymer having a carboxylic anhydride residue with a diazo compound having a hydroxyl group; and a diazo resin obtained by reacting a polyisocyanate compound with a diazo compound having a hydroxyl group.

The content of the diazo resin (D) is preferably within a range from 1 to 15% by weight based on the solid content of the composition. When the content of the diazo resin (D) is less than 1% by weight, a sufficient adhesion with metal is not attained. On the other hand, when the content of the diazo resin (D) is more than 15% by weight, the unreacted iazo resin may remain and the non-image area of the photosensitive lithographic printing plate may be contaminated with ink. If necessary, two or more diazo resins (D) may be used in combination.

<(E) Binder Resin>

As the binder resin (E) in the present invention, there can be used a binder resin which has conventionally been used in a negative-working photosensitive lithographic printing plate. As the binder resin, for example, there can be used copolymers such as (meth)acrylic acid-(meth)acrylate copolymer, copolymer containing hydroxyalkyl (meth)acrylate and (meth)acrylonitrile, copolymer having an aromatic hydroxyl group, and a polymer having a 2-hydroxy-3-phenoxypropyl (meth)acrylate unit; epoxy resins; polyamide resins; vinyl halides such as polyvinyl chloride and polyvinylidene chloride; vinyl polyacetates; polyesters; acetal resins such as formal resin and butyral resin; soluble polyurethane resins which are commercially available from Goodrich Corporation, USA under the trade name of Estan; polystyrenes; styrene-maleic anhydride copolymers or half esters thereof; cellulose derivatives; shellacs; rosin or modified compounds thereof; and copolymers having an unsaturated group in the side chain.

The binder resin (E) is preferably an alkali-soluble resin because it becomes possible to develop it with a developing solution such as an alkali aqueous solution.

The alkali-soluble resin refers to a binder resin which is insoluble in water and is soluble in an alkali aqueous solution, and specific examples thereof include resins having an alkali-soluble group such as carboxyl group, phenolic hydroxyl group, sulfonic acid group, phosphone group, active imino group, or N-sulfonyl amide group.

Examples of the alkali-soluble resin include novolak or resol resins such as phenol-formaldehyde resin, cresol-formaldehyde resin, and phenol-cresol-formaldehyde cocondensed resin; polyhydroxystyrenes such as polyhydroxystyrene and polyhalogenanted hydroxystyrene; acrylic resins having one or more units derived from a monomer having an acidic group, such as N-(4-hydroxyphenyl)methacrylamide, hydroquinone monomethacrylate, N-(sulfamoylphenyl)methacrylamide, N-phenylsulfonyl methacrylamide, N-phenylsulfonyl maleimide, acrylic acid, and methacrylic acid; vinyl-based resins having an active methylene group and a urea bond; polyurethane resins such as polyurethane resin having an N-sulfonyl amide group, an N-sulfonyl ureide group or an N-aminosulfonyl amide group, and polyurethane resin having an active imino group, and polyurethane resin having a carboxyl group; polyamide resins such as polyhydroxypolyamide; and polyester resins having a phenolic hydroxyl group.

As the binder resin (E), a binder resin having a polymerizable unsaturated group such as acryloyl group, methacryloyl group or allyl group in the side chain is preferably used. As such a binder resin causes a crosslinking reaction with the compound having a polymerizable unsaturated group (C) and the crosslink density increases, the resulting photosensitive lithographic printing plate has more improved printing durability.

The content of the binder resin (E) is preferably within a range from 20 to 70% by weight based on the solid content of the negative-working photosensitive composition. When the content of the binder resin (E) is less than 20% by weight, sufficient curing is not attained, resulting in weak image area of the photosensitive lithographic printing plate. On the other hand, when the content of the binder resin (E) is more than 70% by weight, the curing reaction does not proceed efficiently. If necessary, two or more binder resins (E) may be used in combination.

<Negative-working Photosensitive Composition>

To the negative-working photosensitive composition of the present invention, additives known in the art, such as colorants (dyes, pigments), surfactants, plasticizers, stability modifies and polymerization inhibitors can be added, if necessary.

Examples of preferable dye include basic oil-soluble dyes such as Crystal Violet, Malachite Green, Victoria Blue, Methylene Blue, Ethyl Violet, and Rhodamine B. Examples of the commercially available products thereof include "Victoria Pure Blue BOH" (manufactured by HODOGAYA CHEMICAL Co., Ltd.), "Oil Blue #603" (manufactured by Orient Chemical Industries, Ltd.), "VPB-Naps (naphthalenesulfonate of Victoria Pure Blue)" [manufactured by HODOGAYA CHEMICAL Co., Ltd.], and "D11" [manufactured by PCAS Co.]. Examples of the pigment include Phthalocyanine Blue, Phthalocyanine Green, Dioxadine Violet, and Quinacridone Red.

Examples of the surfactant include fluorine-based surfactants and silicone-based surfactants.

Examples of the plasticizer include diethyl phthalate, dibutyl phthalate, dioctyl phthalate, tributyl phosphate, trioctyl phosphate, tricresyl phosphoate, tri(2-chloroethyl)phosphate, and tributyl citrate.

As the stability modifier known in the art, for example, phosphoric acid, phosphorous cid, oxalic acid, tartaric acid, malic acid, citric acid, dipicolinic acid, polyacrylic acid, benzenesulfonic acid, and toluenesulfonic acid can also be used in combination.

Examples of the polymerization inhibitor include known phenolic compounds, quinones, N-oxide compounds, amine-based compounds, sulfide group-containing compounds, nitro group-containing compounds, and transition metal compounds. Specific examples thereof include hydroquinone, p-methoxyphenol, p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, and N-nitrosophenylhydroxyamine primary cerium salt.

The amount of these additives to be added varies depending on the purpose, but is preferably within a range from 0 to 30% by weight based on the solid content of the photosensitive composition.

In the negative-working photosensitive composition described above, as the infrared absorber (A) is used in combination with the organoboron compound (B) which functions as a polymerization initiator by using in combination with the infrared absorber (A), the polymerization of the compound having a polymerizable unsaturated group (C) proceeds due to infrared rays. Also the decomposition and crosslinking of the diazo resin (D) proceed when the infrared absorber (A) absorbs infrared rays. Therefore, this negative-working photosensitive composition can be cured by infrared rays.

Although the reason is not elucidated, by using the organoboron compound (B) as the polymerization initiator, polymerization inhibition is less likely to be caused by oxygen during the radical polymerization. Also curing proceeds by the decomposition and crosslinking of the diazo resin (D), which is not influenced by oxygen. Therefore an influence of oxygen on polymerization inhibition is reduced. Adhesion with the support made of metal is remarkably improved by the diazo resin (D).

As described above, by using the negative-working photosensitive composition, which is less likely to cause polymerization inhibition by oxygen during radical polymerization and also exhibit high adhesion with metal, as a photosensitive layer of a negative-working photosensitive lithographic printing plate, it becomes possible to obtain a negative-working photosensitive lithographic printing plate which has high sensitivity and is excellent in printing durability.

<Negative-working Photosensitive Lithographic Printing Plate>

The negative-working photosensitive lithographic printing plate of the present invention is generally composed of a support and a photosensitive layer made of the above negative-working photosensitive composition formed on the support.

Examples of the support include metal plates made of aluminum, zinc, copper, stainless steel, and iron; plastic films made of polyethylene terephthalate, polycarbonate, polyvinyl acetal, and polyethylene; papers melt-coated or coated with a synthetic resin, and composite materials obtained by forming a metal layer on a plastic film by techniques such as vacuum deposition or laminating; and materials used as the support of the lithographic printing plate. Among these supports, aluminum and a composite support coated with aluminum are preferably used.

The surface of the aluminum support is preferably surface-treated for the purpose of improving adhesion with the photosensitive layer by enhancing the water retentivity. Examples of the surface treatment include roughening methods such as a brush polishing method, a ball polishing method, an electrolytic etching method, a chemical etching method, a liquid honing polishing method, a sand blasting method, and combinations thereof. Among these methods, a roughening treatment including the use of electrolytic etching is preferred.

The electrolytic bath used in electrolytic etching contains an aqueous solution containing an acid, an alkali or a salt thereof, or an aqueous solution containing an organic solvent. Among these solutions, an electrolytic solution containing hydrochloric acid, nitric acid, or a salt thereof is particularly preferred.

The roughened aluminum support is optionally subjected to a desmutting treatment using an aqueous solution of an acid or alkali. The aluminum support thus obtained is preferably anodized. In particular, an anodizing treatment in a bath containing sulfuric acid or phosphoric acid is preferable.

If necessary, the aluminum support can be treated with a silicate (sodium silicate, potassium silicate), treated with a potassium zirconate fluoride, treated with phosphomolybdate, treated with polyacrylic acid, treated with polyvinylsulfonic acid, treated with phosphonic acid, treated with phytic acid, treated with a salt of a hydrophilic organic polymer compound and a divalent metal, treated by undercoating with a water-soluble polymer having a sulfonic acid group, treated with an acidic dye, or treated by electrodeposition with silicate.

Also an aluminum support obtained by subjecting to a sealing treatment after a roughening treatment (graining treatment) and an anodizing treatment is preferable. The sealing treatment is preferably conducted by dipping the aluminum support in hot water or a hot aqueous solution containing an inorganic or organic salt, or using a steam bath.

The negative-working photosensitive lithographic printing plate of the present invention is produced by applying a solution, which is prepared by dissolving or dispersing the negative-working photosensitive composition in an organic solvent, on the surface of the support, and drying the coating film to form a photosensitive layer.

As the organic solvent into which the negative-working photosensitive composition is dissolved or dispersed, conventional organic solvents known in the art can be used. Among these organic solvents, those having a boiling point within a range from 40 to 200° C., and particularly from 60 to 160° C., are selected in view of convenience during drying.

Examples of the organic solvent include alcohols such as methyl alcohol, ethyl alcohol, n- or iso-propyl alcohol, n- or iso-butyl alcohol, and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone, and acetylacetone; hydrocarbons such as hexane, cyclohexane, heptane, octane, nonane, decane, benzene, toluene, xylene, and methoxybenzene; acetates such as ethylacetate, n- or iso-propylacetate, n- or iso-butylacetate, ethylbutylacetate, and hexylacetate; halides such as methylene dichloride, ethylene dichloride, and monochlorobenzene; ethers such as iso-propyl ether, n-butyl ether, dioxane, dimethyl dioxane, and tetrahydrofuran; polyhydric alcohols and derivatives thereof, such as ethylene glycol, ethylene glycol monomethyl ether, ethylene glycol monomethyl ether acetate, ethylene glycol monoethyl ether, ethylene glycol monoethyl ether acetate, ethylene glycol monobutyl ether, ethylene glycol monobutyl ether acetate, ethylene glycol dimethyl ether, ethylene glycol diethyl ether, ethylene glycol dibutyl ether, methoxymethoxy ethanol, diethylene glycol monomethyl ether, diethylene glycol dimethyl ether, diethylene glycol methyl ethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, 3-methyl-3-methoxybutanol, and 1-methoxy-2-propanol; and special solvents such as dimethyl sulfoxide, N,N-dimethylformamide, methyl lactate, and ethyl lactate. These organic solvents can be used alone or in combination. The solid content in the negative-working photosensitive composition to be applied is preferably controlled within a range from 2 to 50% by weight. The solid content as used herein refers to components except for the organic solvent.

As the coating method of the negative-working photosensitive composition, for example, roll coating, dip coating, air knife coating, gravure coating, gravure offset coating, hopper coating, blade coating, wire doctor coating, and spray coating methods are used. The coating weight of the negative-working photosensitive composition is preferably within a range from 10 to 100 $ml/m^2$.

The negative-working photosensitive composition applied on the support is usually dried with heated air. The drying temperature (temperature of heated air) is preferably within a range from 30 to 200° C., and particularly preferably from 40 to 140° C. A method of raising the temperature stepwise can also be carried out, in addition to a method of maintaining a constant temperature during drying.

Preferred results can sometimes be obtained by removing moisture in the drying air. The dried air is preferably fed to the coated surface at a rate within a range from 0.1 to 30 m/s, and particularly preferably from 0.5 to 20 m/s.

The coating weight of the negative-working photosensitive composition is within a range from about 0.5 to 5 $g/m^2$ in terms of dry weight.

As the negative-working photosensitive lithographic printing plate of the present invention is usually subjected to laser irradiation in air, a protective layer can also be formed on the photosensitive layer. The protective layer prevents penetration of low molecular compounds such as oxygen and basic substances existing in the air, which inhibit the polymerization reaction in the photosensitive layer, into the photosensitive layer, thus making it possible to perform laser irradiation in air. Therefore, performances required to the protective layer include low permeability of low molecular compounds such as oxygen, excellent transmitting properties of light used in exposure, excellent adhesion with the photosensitive layer, and easy removal by the development after laser irradiation.

As the material of the protective layer, for example, a water-soluble polymer compound having comparatively excellent crystallinity can be used. Specific examples thereof include water-soluble polymers such as polyvinyl alcohol, polyvinyl pyrrolidone, acidic celluloses, gelatin, gum arabic, and polyacrylic acid. The use of polyvinyl alcohol as a main component gives most preferable results in view of basic characteristics such as oxygen barrier properties and development-eliminating properties. The polyvinyl alcohol used for the protective layer may be partially substituted with ester, ether and acetal as far as it contains an unsubstituted vinyl alcohol unit for required oxygen barrier properties and water solubility. Similarly, it may partially contain the other copolymer component.

Examples of the polyvinyl alcohol (PVA) include those which are 71 to 100% hydrolyzed and have a molecular weight within a range from 300 to 2400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8, which are manufactured by Kuraray Co., Ltd.

The component (selection of PVA, use of additive) and the coating weight of the protective layer are selected taking account of fog, adhesion and scratch resistance, in addition to oxygen barrier properties and development-eliminating properties. As the hydrolysis rate of PVA to be used (the higher the content of the unsubstituted vinyl alcohol unit in the protective layer) and film thickness becomes higher, oxygen barrier properties are improved and it is advantageous in view of sensitivity. However, when oxygen barrier properties are remarkably improved, an unnecessary polymerization reaction may arise during the manufacturing and storage and there may arise problems such as unnecessary fog and image line thickening during laser irradiation. Also adhesion in the image area and scratch resistance are very important in view of handling of the plate. When a hydrophilic layer made of a water-soluble polymer is laminated on a hydrophilic polymerized layer, film release due to low adhesion is likely to arise and the released portion causes defects such as poor film curing due to polymerization inhibition of oxygen. The method of improving adhesion between two layers includes a method of mixing 20 to 60% by weight of an acrylic emulsion or a water-insoluble vinyl pyrrolidone-vinyl acetate copolymer with a hydrophilic polymer composed mainly of polyvinyl alcohol.

The negative-working photosensitive lithographic printing plate of the present invention can be used as a so-called computer-to-plate (CTP) plate capable of directly writing images on a plate, based on digital image information from a computer, using a laser.

In the present invention, as the negative-working photosensitive lithographic printing plate can be handled in daylight, a high-output laser having a maximum intensity within a near infrared or infrared range is used most preferably. Examples of the high-output laser having a maximum intensity within a near infrared or infrared range include various lasers having a maximum intensity within a near infrared or infrared range from 760 nm to 1200 nm, for example, a semiconductor laser and YAG laser.

The negative-working photosensitive lithographic printing plate of the present invention is written with images in the photosensitive layer using laser light and the images are developed to remove the non-image area using a wet developing method. A lithographic printing plate wherein an image area is formed is then obtained. In the present invention, the development may be conducted immediately after laser irradiation, but a heat treatment step can also provided between the laser irradiation step and the development step. The heat treatment is preferably conducted at a temperature within a range from 80 to 150° C. for 10 seconds to 5 minutes. This heat treatment can decrease laser energy required to write images during laser irradiation.

An example of the developing solution used in the developing treatment includes an aqueous alkali solution (basic aqueous solution).

Examples of the alkali agent used in the developing solution include inorganic alkali compounds such as sodium silicate, potassium silicate, potassium hydroxide, sodium hydroxide, lithium hydroxide, a sodium, potassium or ammonium salt of secondary or tertiary phosphoric acid, sodium metasilicate, sodium carbonate, and ammonia; and organic alkali compounds such as monomethylamine, dimethylamine, trimethylamine, monoethylamine, diethylamine, triethylamine, monoisopropylamine, diisopropylamine, n-butylamine, di-n-butylamine, monoethanolamine, diethanolamine, triethanolamine, ethyleneimine, and ethylenediamine.

The content of the alkali agent in the developing solution is preferably within a range from 0.005 to 10% by weight, and particularly preferably from 0.05 to 5% by weight. When the content of the alkali agent in the developing solution is less than 0.005% by weight, poor development tends to result. On the other hand, when the content is more than 10% by weight, an adverse influence such as erosion of the image area during the development is likely to be exerted. Therefore, it is not preferred.

The organic solvent can also be added to the developing solution. Examples of the organic solvent include ethyl acetate, butyl acetate, amyl acetate, benzyl acetate, ethylene glycol monobutylacetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methylphenyl carbitol, n-amyl alcohol, methylamyl alcohol, xylene, methylene dichloride, ethylene dichloride, and monochlorobenzene.

The amount of the organic acid to be added to the developing solution is preferably 20% by weight or less, and particularly preferably 10% by weight or less.

If necessary, the developing solution can contain water-soluble sulphites such as such as lithium sulfite, sodium sulfite, potassium sulfite, and magnesium sulfite; hydroxyaromatic compounds such as an alkali-soluble pyrazolone compound, alkali-soluble thiol compound, and methyl resorcin; hard water softening agents such as polyphosphate and aminopolycarboxylate; and various surfactants, for example, anionic surfactants such as sodium isopropylnaphthalenesulfonate, sodium n-butylnaphthalenesulfonate, sodium N-methyl-N-pentadecylaminoacetate, and sodium lauryl sulfate, cationic surfactants, amphoteric surfactants, and fluorine surfactant; and various defoamers.

As the developing solution, a commercially available developing solution for a negative or positive presensitized (PS) plate can be used in practice. Specifically, a solution prepared by diluting a commercially available concentrated developing solution for a negative or positive PS plate by 1 to 1000 times can be used as the developing solution in the present invention.

The temperature of the developing solution is preferably within a range from 15 to 40° C. and the dipping time is preferably within a range from one second to 2 minutes. If necessary, the surface can also be slightly rubbed during the development.

The developed lithographic printing plate is washed with water and/or treated with a water-based desensitizing agent (finishing gum). Examples of the water-based desensitizing agent include an aqueous solution of water-soluble natural polymers such as gum arabic, dextrin, and carboxymethylcellulose; and water-soluble synthetic polymers such as polyvinyl alcohol, polyvinyl pyrrolidone, and polyacrylic acid. If necessary, an acid or a surfactant is added to these water-based desensitizing agents. After treating with the desensitizing agent, the lithographic printing plate is dried and then used in printing as a machine plate.

For the purpose of improving printing durability of the resulting lithographic printing plate, the lithographic printing plate can also be subjected to a burning treatment or a post exposure treatment after the development treatment.

The burning treatment can be performed by the steps of (i) first, washing the lithographic printing plate obtained by the treatment method descried above to remove the rinsing solution or the gum solution, followed by squeegeing; (ii) subsequently extending a counter-etching solution in a uniform manner on the entire plate, followed by drying; (iii) burning the plate for 1 minute to 30 minutes in an oven at a temperature within a range from 180 to 300° C., and (iv) removing the counter-etching solution by washing the plate with water after the plate is cooled, followed by gum coating and further drying.

The post exposure treatment is performed by subjecting the surface of the image area side of the lithographic printing plate to whole surface exposure after the development treatment. The post exposure treatment is preferably subjected to whole surface exposure at exposure energy which is 50 times or less, more preferably 1 to 30 times, and still more preferably 2 to 15 times, higher than that in case of laser irradiation. When the exposure energy upon post exposure is more than 50 times higher than that in case of laser irradiation, sufficient printing durability may not be obtained.

The exposure energy upon post exposure is not specifically limited as far as it satisfies the above-described relation with the exposure energy in case of laser irradiation, but is preferably within a range from 10 $mJ/cm^2$ to 10 $J/cm^2$, and more preferably from 50 $mJ/cm^2$ to 8 $Jcm^2$, in view of treatment time.

Examples of light source used for post exposure include, but are not limited to, a carbon arc lamp, a high-pressure mercury lamp, an ultrahigh-pressure mercury lamp, a low-pressure mercury lamp, a deep UV lamp, a xenon lamp, a metal halide lamp, a fluorescent lamp, a tungsten lamp, a halogen lamp, and an excimer laser lamp. Among these lamps, a mercury lamp and a metal halide lamp are preferable, and a mercury lamp is particularly preferable.

The post exposure treatment may be performed while the lithographic printing plate is allowed to stand or is continuously transferred. In view of strength of the image area, light intensity on the surface of the lithographic printing plate is preferably controlled within a range from 20 $mW/cm^2$ to 1 $W/cm^2$, and more preferably from 30 $mW/cm^2$ to 500 mW/cm. The light intensity on the surface of the lithographic printing plate can be controlled within the range described above using a method of exposing light, comprising increasing an output (W) of a light source by increasing an output of a light source to be used, or increasing an output of a light source by increasing an output per unit length in case of a bar-shaped light source, or a method of exposing to light by enabling the surface of the lithographic printing plate to come closer to a light source.

Upon post exposure, the surface temperature of the lithographic printing plate is preferably controlled within a range from 40 to 300° C., and more preferably from 50 to 200° C., by radiant heat from a post exposure light source, or heating using a hot plate, dryer or ceramic heater. Radiant heat from a light source is preferably employed as heating means because it is simple and easy.

The negative-working photosensitive lithographic printing plate described above is less likely to suffer polymerization inhibition by oxygen during radical polymerization, and also has high sensitivity and is excellent in printing durability because a negative-working photosensitive composition having high adhesion is used as a photosensitive layer.

The negative-working photosensitive composition of the present invention can be used for various purposes, such as a photoresist and a color filter, in addition to the use as a lithographic printing plate.

EXAMPLES

The present invention will be described in more detail by way of examples, but the present invention is not limited to these examples.

(Synthesis of Acrylic Resin (E-1))

In a 500 ml three-necked flask equipped with a capacitor and a stirrer, 200.00 g of methyl ethyl ketone was charged and, after replacing the atmosphere in the flask by nitrogen, the liquid was heated to 65° C. Then, a solution prepared by dissolving 18.00 g (0.142 mols) of allyl methacrylate, 9.00 g (0.169 mols) of acrylonitrile, 3.00 g (0.034 mols) of methacrylic acid and 0.40 g of 2,2'-azobis(2,4-dimethylvaleronitrile) in 70.00 g of methyl ethyl ketone was added dropwise over 2 hours. One hour after the completion of the dropwise addition, 0.20 g of 2,2'-azobis(2,4-dimethylvaleronitrile) was added, followed by heating for 4 hours. The reaction solution was poured into 2 liters of water while stirring to precipitate a white polymer. The resulting polymer was washed with water and then vacuum-dried to obtain an acrylic resin (E-1). The amount of the resulting polymer was 28.50 g and the yield was 95% by weight.

(Synthesis of Acrylic Resin (E-2))

In a 500 ml three-necked flask equipped with a capacitor and a stirrer, 150.00 g of ethylene glycol monomethyl ether was charged and, after replacing the atmosphere in the flask by nitrogen, the liquid was heated to 80° C. Then, a solution prepared by dissolving 40.00 g (0.307 mols) of hydroxyethyl methacrylate, 30.00 g (0.565 mols) of acrylonitrile, 10.00 g (0.099 mols) of methyl methacrylate, 10.00 g (0.116 mols) of methacrylic acid and 0.40 g of 2,2'-azobisisobutyronitrile in 60.00 g of ethylene glycol monomethyl ether was added dropwise over 2 hours. One hour after the completion of the dropwise addition, 0.20 g of 2,2'-azobisisobutyronitrile was added, followed by heating for 8 hours. The reaction solution was poured into 2 liters of water while stirring to precipitate an yellowish white polymer. The resulting polymer was washed with water and then vacuum-dried to obtain an acrylic resin (E-2). The amount of the resulting polymer was 85.50 g and the yield was 95% by weight.

Example 1

As shown in the formulation in Table 1, 0.2 g (2% by weight) of a near infrared absorbable cationic dye (A-1) represented by the following formula (A-1) as the infrared absorber (A), 0.6 g (6% by weight) of an organoboron compound (B-1) represented by the following formula (B-1) as the organoboron compound (B), 3.0 g (30% by weight) of a polyfunctional urethane acrylate (manufactured by Bomar Co., UR-3447) as the compound having a polymerizable unsaturated group (C), 0.9 g (9% by weight) of a 2-hydroxy-4-methoxybenzophenone-5-sulfonate of a condensate of paradiazodiphenylamine and formaldehyde as the diazo resin (D), 4.8 g (48% by weight) of an acrylic resin (E-1), which is an alkali-soluble resin, as the binder resin (E), 0.2 g of DC-190 (10%, ethylene glycol monomethyl ether solution, manufactured by Eastman Kodak Company) as the surfactant, and 0.3 g of Crystal Violet as the colorant were dissolved in a solvent mixture of 70.0 g of ethylene glycol monomethyl ether and 20.0 g of methyl ethyl ketone to prepare a coating solution of a negative-working photosensitive composition.

An aluminum plate having a thickness of 0.30 mm was degreased with an aqueous sodium hydroxide and then electrolytically grained in a 2% hydrochloric acid bath to obtain a grained plate having a center line average roughness (Ra) of 0.55 μm. The resulting grained plate was anodized in a 20% sulfuric acid bath at a current density of 2 A/dm$^2$ to form an oxide film of 2.6 g/m$^2$, was passed through an aqueous 2.5% sodium silicate at 70° C. for 30 seconds, was washed with water and was then dried to obtain an aluminum support. On the aluminum support, the coating solution of the negative-working photosensitive composition was applied using a roll coater and dried at 100° C. for 40 seconds to obtain a negative-working photosensitive lithographic printing plate. The weight of the dry coating was 1.5 g/m$^2$.

Using this photosensitive lithographic printing plate immediately after the production, imagewise exposure was conducted by an exposing machine (Trendsetter 3244, manufactured by CREO Corp., wavelength: 830 nm, laser power: 10 W, rotational speed: 185 rpm) equipped with a near infrared semiconductor laser. Using an automatic processor (manufactured by FUJI PHOTO FILM CO., LTD., PS-900N) and a developing solution (manufactured by FUJI PHOTO FILM CO., LTD., a mixture of 80 parts by weight of a developing solution DN-6, 120 parts by weight of water and 200 parts by weight of a surfactant PELEX NBL manufactured by Kao Corporation.), the exposed photosensitive lithographic printing plate was subjected to a developing treatment at 30° C. for 20 seconds. Sensitivity and printing durability of the resulting lithographic printing plate were evaluated. The results are shown in Table 2.

(Sensitivity)

With respect to the dot size of the lithographic printing plate after being subjected to the development treatment, reproducibility was confirmed and evaluated, In Table 2, with respect to the evaluation criteria, “A” is excellent in dot reproducibility, and the rating becomes poor in the sequence of “B”, “C”, and “D”, and “E” is the most poor.

(Printing Durability)

The lithographic printing plate used in the evaluation of sensitivity was affixed to a printing press (Sprint-26 (manufactured by Komori Corporation) and subsequently printing was performed using GEOS-G (manufactured by DAINIPPON INK & CHEMICALS Co., Ltd.) as the ink and NA108-W (manufactured by DAINIPPON INK & CHEMICALS Co., Ltd.) as the fountain solution. The printing test was performed by stopping the printing press every 30,000 impressions and the image area was observed. Printing durability was evaluated from the degree of ablation. In Table 2, with respect to the evaluation criteria, “A” is excellent in printing durability, and the rating becomes poor in the sequence of “B”, “C”, and “D”, and “E” is the most poor.

Examples 2 and 3, Comparative Examples 1 to 4

In the same manner as in Example 1, except that the formulation of the coating solution was changed as shown in Table 1, negative-working photosensitive lithographic printing plates were produced and evaluated. The results are shown in Table 2. The organoboron compound (B-2) in the Table 1 has a structure represented by the following formula (B-2), and the near infrared absorbable cationic dye (A-2) has a structure represented by the following formula (A-2).

TABLE 1

| | Coating solution of negative-working photosensitive composition Unit: g | | | | | | |
|---|---|---|---|---|---|---|---|
| | Examples | | | Comparative Examples | | | |
| | 1 | 2 | 3 | 1 | 2 | 3 | 4 |
| Near infrared absorbable cationic dye (A-1) | 0.2 | | 0.2 | 0.2 | 0.2 | 0.2 | 0.2 |
| Near infrared absorbable cationic dye (A-2) | | 0.2 | | | | | |
| Organoboron compound (B-1) | 0.6 | | 0.6 | 0.6 | 0.6 | | 0.6 |
| Organoboron compound (B-2) | | 0.6 | | | | | |
| Polyfunctional urethane acrylate | 3.0 | 3.0 | 3.0 | 3.0 | 3.0 | 3.0 | |
| 2-hydroxy-4-methoxybenzophenone-5-sulfonate of condensate of paradiazodiphenylamine with formaldehyde | 0.9 | 0.9 | | | | 0.9 | 0.9 |

TABLE 1-continued

| | Coating solution of negative-working photosensitive composition Unit: g | | | | | | |
|---|---|---|---|---|---|---|---|
| | Examples | | | Comparative Examples | | | |
| | 1 | 2 | 3 | 1 | 2 | 3 | 4 |
| p-toluenesulfonate of condensate of paradiazodiphenylamine with formaldehyde | | | 0.9 | | | | |
| 2-hydroxy-4-methoxybenzophenone-5-sulfonate of paradiazodiphenylamine | | | | | 0.9 | | |
| Acrylic resin (E-1) | 4.8 | 4.8 | 4.8 | 4.8 | 4.8 | 4.8 | |
| Acrylic resin (E-2) | | | | | | | 4.8 |
| DC190 (10% solution) | 0.2 | 0.2 | 0.2 | 0.2 | 0.2 | 0.2 | 0.2 |
| Crystal Violet | 0.3 | 0.3 | 0.3 | 0.3 | 0.3 | 0.3 | 0.3 |
| Ethylene glycol monomethyl ether | 70.0 | 70.0 | 70.0 | 70.0 | 70.0 | 70.0 | 70.0 |
| Methyl ethyl ketone | 20.0 | 20.0 | 20.0 | 20.0 | 20.0 | 20.0 | 20.0 |

TABLE 2

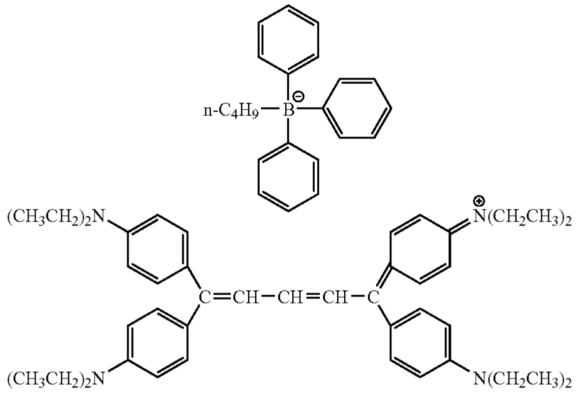

(A-1)

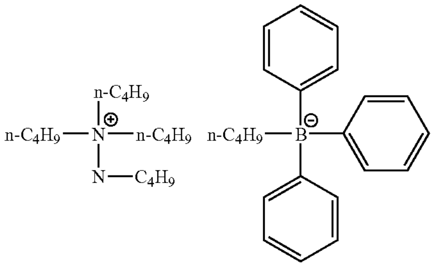

(B-1)

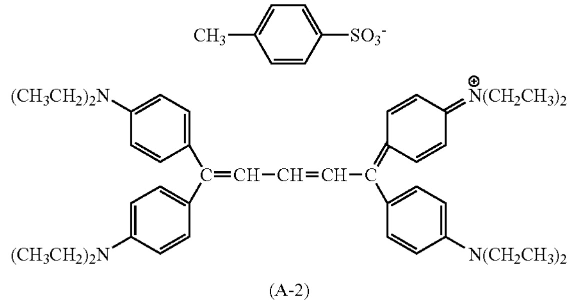

(A-2)

TABLE 2-continued

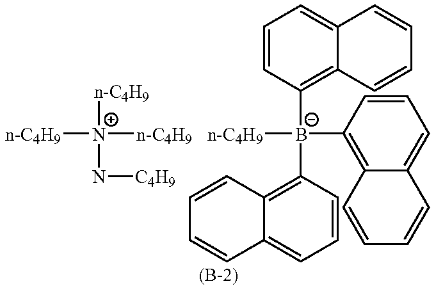

(B-2)

| | Examples | | | Comparative Examples | | | |
|---|---|---|---|---|---|---|---|
| Evaluation | 1 | 2 | 3 | 1 | 2 | 3 | 4 |
| Sensitivity | A | B | A | E | E | E | E |
| Printing durability | A | B | A | E | E | E | E |

As is apparent from the results shown in Table 2, the negative-working photosensitive lithographic printing plates of Examples 1 to 3 exhibited high sensitivity and were excellent in printing durability. On the other hand, the negative-working photosensitive lithographic printing plates of Comparative Examples 1 and 2 wherein the photosensitive layer contains no diazo resin (D), the negative-working photosensitive lithographic printing plate of Comparative Example 3 wherein the photosensitive layer contains no organoboron compound (B) and the negative-working photosensitive lithographic printing plate of Comparative Example 4 wherein the photosensitive layer contains no compound having a polymerizable unsaturated group (C) exhibited low sensitivity and were inferior in printing durability.

(Synthesis of Polyurethane Resin)

In a 500 ml three-necked flask equipped with a capacitor and a stirrer, after replacing the atmosphere in the flask with nitrogen, 21.50 g (0.1 mols) of 2,2-bis(hydroxymethyl) propionic acid, 5.30 g (0.05 mols) of diethylene glycol and 6.60 g (0.05 mols) of glycerol monoallyl ether were added and then dissolved in 125.25 g of 1,4-dioxane. 0.30 g of di-n-butyltin dilaurate as the catalyst was added and then 50.10 g (0.2 mols) of 4,4-diphenylmethane diisocyanate was added, followed by heating at 100° C. for 5 hours. The reaction was completed after confirming by IR measurement that remaining isocyanate groups disappeared. The reaction solution was poured into 2 liters of water to precipitate a white polymer. The polymer was washed with water and then vacuum-dried to obtain a polyurethane resin having a carboxyl group and an allyl group. The amount of the resulting polymer was 75.00 g and the yield was 90% by weight.

Example 4

As shown in the formulation in Table 3, 0.2 g (2% by weight) of a near infrared absorbable cationic dye (A-1) represented by the following formula (A-1) as the infrared absorber (A), 0.6 g (6% by weight) of an organoboron compound (B-1) represented by the following formula (B-1) as the organoboron compound (B), 3.0 g (30% by weight) of a polyfunctional urethane acrylate. (manufactured by Bomar Co., UR-3447) as the compound having a polymerizable unsaturated group (C), 0.9 g (9% by weight) of a 2-hydroxy-4-methoxybenzophenone-5-sulfonate of a condensate of paradiazodiphenylamine and formaldehyde as the diazo resin (D), 4.8 g (48% by weight) of the above polyurethane resin, which is an alkali-soluble resin, as the binder resin (E), 0.2 g of DC-190 (10%, ethylene glycol monomethyl ether solution, manufactured by Eastman Kodak Company) as the surfactant, and 0.3 g of Crystal Violet as the colorant were dissolved in a solvent mixture of 70.0 g of ethylene glycol monomethyl ether and 20.0 g of methyl ethyl ketone to prepare a coating solution of a negative-working photosensitive composition.

An aluminum plate having a thickness of 0.30 mm was degreased with an aqueous sodium hydroxide and then electrolytically polished in a 2% hydrochloric acid bath to obtain a grained plate having a center line average roughness (Ra) of 0.6 μm. The resulting grained plate was anodized in a 20% sulfuric acid bath at a current density of 2 $A/dm^2$ to form an oxide film of 2.7 $g/m^2$, which was passed through an aqueous 2.5% sodium silicate at 70° C. for 30 seconds, washed with water and then dried to obtain an aluminum support. On the aluminum support, the coating solution of the negative-working photosensitive composition was applied using a roll coater and dried at 100° C. for one minute to obtain a negative-working photosensitive lithographic printing plate. The weight of the dry coating film was 1.5 $g/m^2$.

Using this photosensitive lithographic printing plate immediately after the production, imagewise exposure was conducted by an exposing machine (Trendsetter 3244, manufactured by CREO Corp., wavelength: 830 nm, laser power: 9 W, rotational speed: 150 rpm) equipped with a near infrared semiconductor laser. Using an automatic processor (manufactured by FUJI PHOTO FILM CO., LTD., PS-900N) and a developing solution (manufacture by FUJI PHOTO FILM CO., LTD., a solution mixture of 80 parts by weight of a developing solution DN-6, 120 parts by weight of water and 200 parts by weight of a surfactant PELEX NBL manufactured by Kao Corporation.), the exposed photosensitive lithographic printing plate was subjected to a developing treatment at 30° C. for 25 seconds. Sensitivity and printing durability of the resulting lithographic printing plate were evaluated. The results are shown in Table 4.

(Sensitivity)

With respect to the dot size of the lithographic printing plate after being subjected to the development treatment, reproducibility was confirmed and evaluated, In Table 2, with respect to the evaluation criteria, “A” is excellent in dot reproducibility, and the rating becomes poor in the sequence of “B”, “C”, and “D”, and “E” is the most poor.

(Printing Durability)

The lithographic printing plate used in the evaluation of sensitivity was affixed to a printing press (Sprint-26 (manufactured by Komori Corporation) and subsequently printing was performed using EOS-G (manufactured by DAINIPPON INK & CHEMICALS Co., Ltd.) as the ink and NA108-W (manufactured by DAINIPPON INK & CHEMICALS Co., Ltd.) as the fountain solution. The printing test was performed by stopping the printing press every 30,000 impressions and the image area was observed. Printing durability was evaluated from the degree of ablation. In Table 2, with respect to the evaluation criteria, “A” is excellent in printing durability, and the rating becomes poor in the sequence of “B”, “C”, and “D”, and “E” is the most poor.

Examples 5 and 6

In the same manner as in Example 4, except that the formulation of the coating solution was changed as shown in Table 3, negative-working photosensitive lithographic printing plates were produced and evaluated. The evaluation results are shown in Table 4. The organoboron compound (B-2) in the Table 4 has a structure represented by the formula (B-2), and the near infrared absorbable cationic dye (A-2) has a structure represented by the formula (A-2).

TABLE 3

| | Coating solution of negative-working photosensitive composition unit: g Examples | | |
|---|---|---|---|
| | 4 | 5 | 6 |
| Near infrared absorbable cationic dye (A-1) | 0.2 | | 0.2 |
| Near infrared absorbable cationic dye (A-2) | | 0.2 | |
| Organoboron compound (B-1) | 0.6 | | 0.6 |
| Organoboron compound (B-2) | | 0.6 | |
| Polyfunctional urethaneacrylate | 3.0 | 3.0 | 3.0 |
| 2-hydroxy-4-methoxybenzophenone-5-sulfonate of condensate of paradiazodiphenylamine with formaldehyde | 0.9 | 0.9 | |
| Hexafluorophosphate of condensate of paradiazodiphenylamine with formaldehyde | | | 0.9 |
| Polyurethane resin | 4.8 | 4.8 | 4.8 |
| DC190 (10% solution) | 0.2 | 0.2 | 0.2 |
| Crystal Violet | 0.3 | 0.3 | 0.3 |
| Ethylene glycol monomethyl ether | 70.0 | 70.0 | 70.0 |
| Methyl ethyl ketone | 20.0 | 20.0 | 20.0 |

TABLE 4

| | Examples | | |
|---|---|---|---|
| Evaluation | 4 | 5 | 6 |
| Sensitivity | A | B | A |
| Printing durability | A | B | A |

As is apparent from the results shown in Table 4, the negative-working photosensitive lithographic printing plates of Examples 4 to 6 exhibited high sensitivity and were excellent in printing durability.

EFFECTS OF THE INVENTION

As described above, as the negative-working photosensitive composition of the present invention contains an infrared absorber (A), an organoboron compound (B) which functions as a polymerization initiator by using in combination with the infrared absorber (A), a compound having a polymerizable unsaturated group (C) and a diazo resin (D), the negative-working photosensitive composition can be cured by infrared rays and is less likely to suffer polymerization inhibition by oxygen during radical polymerization, and also exhibits high adhesion with metal.

As the negative-working photosensitive lithographic printing plate of the present invention comprises a support, and a photosensitive layer containing the negative-working photosensitive composition of the present invention formed on the support, the negative-working photosensitive lithographic printing plate is capable of directly forming images by irradiating with infrared rays from a solid or a semiconductor laser based on digital signals, and also has high sensitivity and excellent printing durability.

The invention claimed is:

1. A negative-working photosensitive composition comprising:

(A) an infrared absorber, (B) an organoboron compound which functions as a polymerization initiator by using in combination with the infrared absorber (A), (C) a compound having a polymerizable unsaturated group, and (D) a diazo resin.

2. The negative-working photosensitive composition according to claim 1, wherein the infrared absorber (A) is a near infrared absorbable cationic dye represented by the following formula (1):

$$D^+A^- \quad (1)$$

wherein $D^+$ represents a cationic dye having an absorption within a near infrared range, and $A^-$ represents an anion.

3. The negative-working photosensitive composition according to claim 1, wherein the organoboron compound (B) is an ammonium salt of a quaternary boron anion represented by the following formula (2):

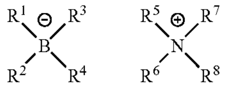

(2)

wherein $R^1$, $R^2$, $R^3$ and $R^4$ each independently represents an alkyl group, an aryl group, an alkaryl group, an allyl group, an aralkyl group, an alkenyl group, an alkynyl group, an alicyclic group, or a saturated or unsaturated heterocyclic group, and at least one of $R^1$, $R^2$, $R^3$ and $R^4$ is an alkyl group having 1 to 8 carbon atoms, and $R^5$, $R^6$, $R^7$ and $R^8$ each independently represents a hydrogen atom, an alkyl group, an aryl group, an allyl group, an alkaryl group, an aralkyl group, an alkenyl group, an alkynyl group, an alicyclic group, or a saturated or unsaturated heterocyclic group.

4. The negative-working photosensitive composition according to claim 1, further comprising a binder resin (E).

5. The negative-working photosensitive composition according to claim 4, wherein the binder resin (E) is an alkali-soluble resin.

6. The negative-working photosensitive composition according to claim 1 wherein the compound having a polymerizable unsaturated group is a monomer or oligomer having at least one addition-polymerizable ethylenically unsaturated group, and comprises 5 to 60% weight based on the solid content of the composition.

7. A negative-working photosensitive lithographic printing plate comprising a support and a photosensitive layer containing the negative-working photosensitive composition according to claim 1 formed on the support.

8. The printing plate of claim 7 wherein the support is an electrolytically etched and anodized aluminum support.

9. The printing plate further comprising an oxygen-impermeable protective layer.

10. A method of imaging comprising direct computer to plate imaging of the printing plate of claim 7.

* * * * *